United States Patent [19]
Negishi

[11] Patent Number: 5,635,759
[45] Date of Patent: Jun. 3, 1997

[54] SEMICONDUCTOR DEVICE FOR MOUNTING HIGH-FREQUENCY ELEMENT

[75] Inventor: Hitoshi Negishi, Tokyo, Japan

[73] Assignee: NEC Corporation, Tokyo, Japan

[21] Appl. No.: 558,089

[22] Filed: Nov. 13, 1995

[30] Foreign Application Priority Data

Nov. 11, 1994 [JP] Japan .................................. 6-277456

[51] Int. Cl.$^6$ .............................. H01L 23/48; H01L 23/52
[52] U.S. Cl. .......................... 257/692; 257/775; 257/735
[58] Field of Search ..................................... 257/735, 736, 257/664, 723, 692, 775

[56] References Cited

U.S. PATENT DOCUMENTS

| | | | |
|---|---|---|---|
| 3,364,400 | 1/1968 | Granberry | 257/695 |
| 4,266,239 | 5/1981 | Miyagaki et al. | 257/664 |
| 4,739,389 | 4/1988 | Goedbloed | 257/664 |

*Primary Examiner*—Mahshid D. Saadat
*Assistant Examiner*—S. V. Clark
*Attorney, Agent, or Firm*—Young & Thompson

[57] ABSTRACT

A semiconductor device includes a base case 12, a first conductive pattern 6 selectively formed on the base case 12 a semiconductor element 1 mounted on the first pattern 6, a second conductive pattern 7 selectively formed on the base case 12 and connected to a first electrode 2 of the semiconductor element 1, the second conductive pattern 7 being separated from the first conductive pattern 6 to form a first parasitic capacitance therebetween, and a third conductive pattern 8 selectively formed on the base case 12 and connected to a second electrode 3 of the semiconductor element 1, the third conductive pattern 8 being separated from the first conductive pattern 6 to form a second parasitic capacitance therebetween, the first parasitic capacitance being larger than the second parasitic capacitance.

3 Claims, 4 Drawing Sheets

SEMICONDUCTOR DEVICE FOR MOUNTING HIGH-FREQUENCY ELEMENT

BACKGROUND OF THE INVENTION

1. Field of the Invention

The present invention relates to a semiconductor device and, more particularly, to a semiconductor device for mounting a high-frequency element.

2. Description of the Prior Art

One of high-frequency elements, such as GaAs compound semiconductor has attracted public attention as a material suited to high-frequency devices, and semiconductor devices for high-frequency amplification using GaAs compound semiconductor have been developed. In order to make possible the use of such semiconductor devices for high-frequency amplification in higher frequency bands, the improvement of gain in high-frequency bands is important.

To achieve this, the improvement of FET elements themselves have been performed. The improvement in gain of FET elements has been achieved by the reduction of gate-source capacitance Cgs by decreasing the gate length Lg, the increase of mutual conductance gm, and the reduction of drain conductance gd and gate-drain capacitance Cgd using offset gate structures.

FIG. 6 is a plan of the case in which a conventional FET element is packaged.

The FET element 1 is mounted on the source metalized pattern 6 of the case 12, and by bonding wires 5, the source electrode 4 is interconnected with the source metalized pattern 6, the gate electrode 2 is interconnected with the gate metalized pattern 7, and the drain electrode 3 is interconnected with the drain metalized pattern 8. Furthermore, metalized pattern 6, 7 and 8 are connected to the source terminal 9, the gate terminal 10 and the drain terminal 11, respectively. A bias voltage is impressed to these terminals 9, 10 and 11 to drive the FET element 1.

A GaAs field effect transistor (FET) is used as the FET element 1, and $Al_2O_3$ is used as the material for the case 12. The metalized pattern are formed of metalized W (tungsten) Ni plated, silver paste, Ni plated and Au plated. When the FET mounts on the source pattern 6 by silver paste, a metal 13 is used for preventing silver paste from flowing.

In the semiconductor package shown in FIG. 5, a desired gain is not achieved when used in high-frequency bands.

The methods for improving FET elements themselves described above have problems that decrease in the gate length Lg is difficult to control and has fluctuation, and that when an offset gate structure is employed, the accurate alignment is difficult, and by such methods, it is difficult to achieve the sufficient gain property improvement effect stably in the present mass-production technology level.

It is an object of the present invention to provide a semiconductor package having an increased a parasitic capacitance between the drain and a ground (GND).

SUMMARY OF THE INVENTION

An object of the present invention is to provide a semiconductor device having a larger parasitic capacitance between the drain and a ground (GND) than the parasitic capacitance between the gate and the source.

According to an aspect of the present invention, there is provided a semiconductor device which includes a base case, a first conductive pattern selectively formed on the base case a semiconductor element mounted on the first pattern, a second conductive pattern selectively formed on the base case and connected to a first electrode of the semiconductor element, the second conductive pattern being separated from the first conductive pattern to form a first parasitic capacitance therebetween, and a third conductive pattern selectively formed on the base case and connected to a second electrode of the semiconductor element, the third conductive pattern being separated from the first conductive pattern to form a second parasitic capacitance therebetween, the first parasitic capacitance being larger than the second parasitic capacitance. Therefore, the parasitic capacitance between the source pattern and the drain pattern increases, as a result, a gain of the semiconductor device mounted on the semiconductor package improves.

BRIEF DESCRIPTION OF THE DRAWINGS

This above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Embodiments of the present invention will be described with the reference to the drawings.

Figure 1:
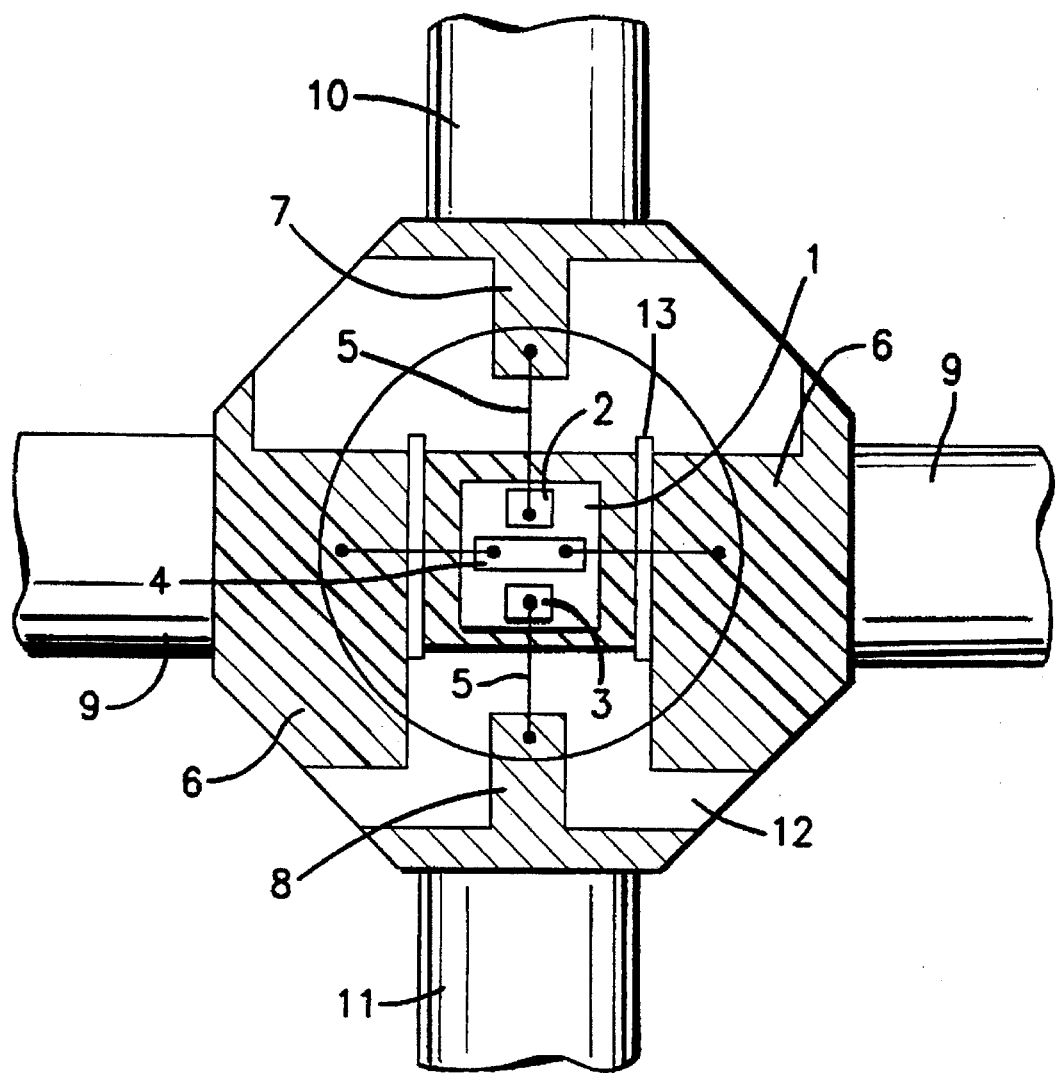
FIG. 1 is a plan view showing the semiconductor device according to the first embodiment of the present invention.

FIG. 1 is a plan view showing the first embodiment of the present invention.

The FET element 1 is mounted on the source metalized pattern 6 of the case 12, and by bonding wires 5, the source electrode 4 is interconnected with the source metalized pattern 6, the gate electrode 2 is interconnected with the gate metalized pattern 7, and the drain electrode 3 is interconnected with the drain metalized pattern 8. Furthermore, metalized pattern 6, 7 and 8 are connected to the source terminal 9, the gate terminal 10 and the drain terminal 11, respectively. A bias voltage is impressed to these terminals 9, 10 and 11 to drive the FET element 1.

Figure 6:
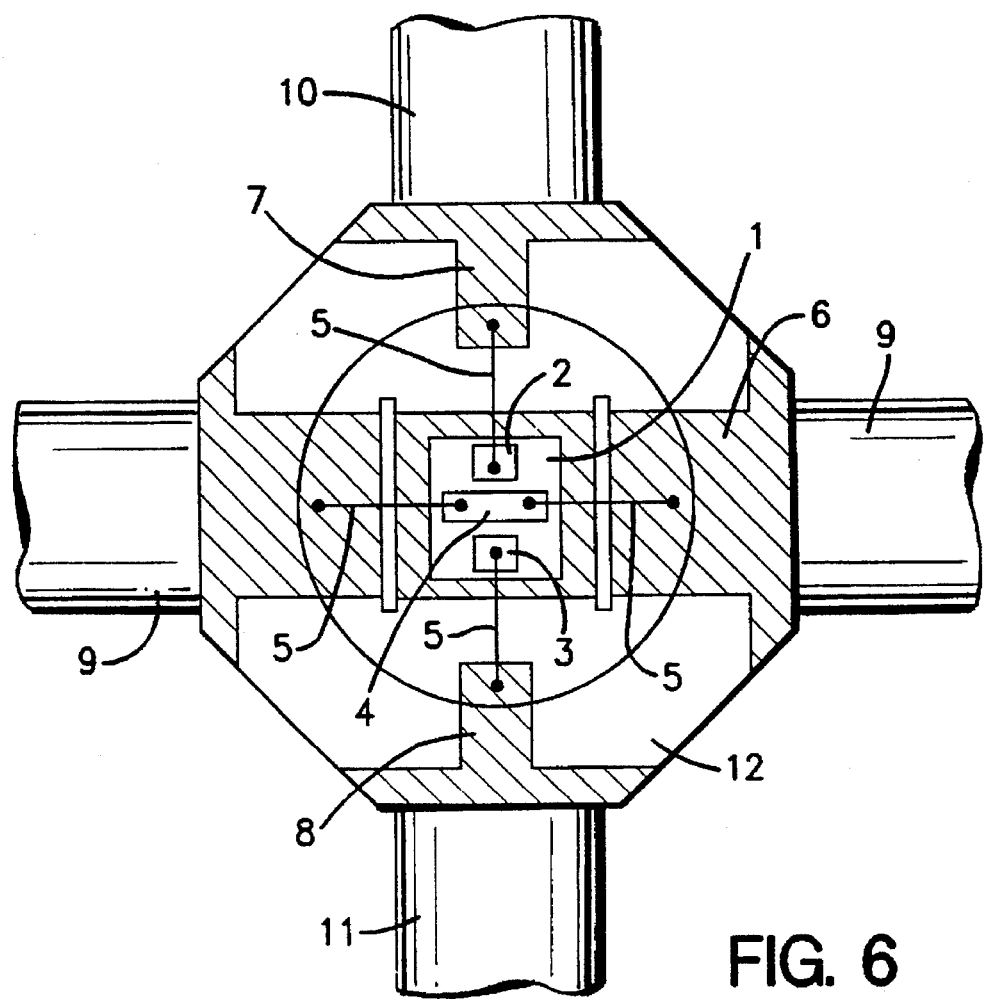
FIG. 6 is a plan view showing a prior art semiconductor device.

A GaAs field effect transistor (FET) is used as the FET element 1, and $Al_2O_3$ is used as the material for the case 12. The metalized pattern are formed of metalized W, which are Ni plated, silver brazed, Ni plated and Au plated. The source metalized pattern 6 at the root of the source terminal 9 have a form extending toward the drain metalized pattern 8 to decrease an average distance between the source metalized pattern 6 and the drain metalized pattern 8, as shown in FIG. 1, as compared to the average distance apparent in FIG. 6, thus increasing the output side parasitic capacitance by 0.1 pF. Indeed, as shown in FIG. 1, the source metalized pattern 6 has a convex part formed as an elongation toward the drain metalized pattern 8 and has a larger width than that shown in FIG. 6 and has a longer length than that shown in FIG. 6.

Next, the characteristics of the GaAs FET using the above semiconductor device will be described.

Figure 2:
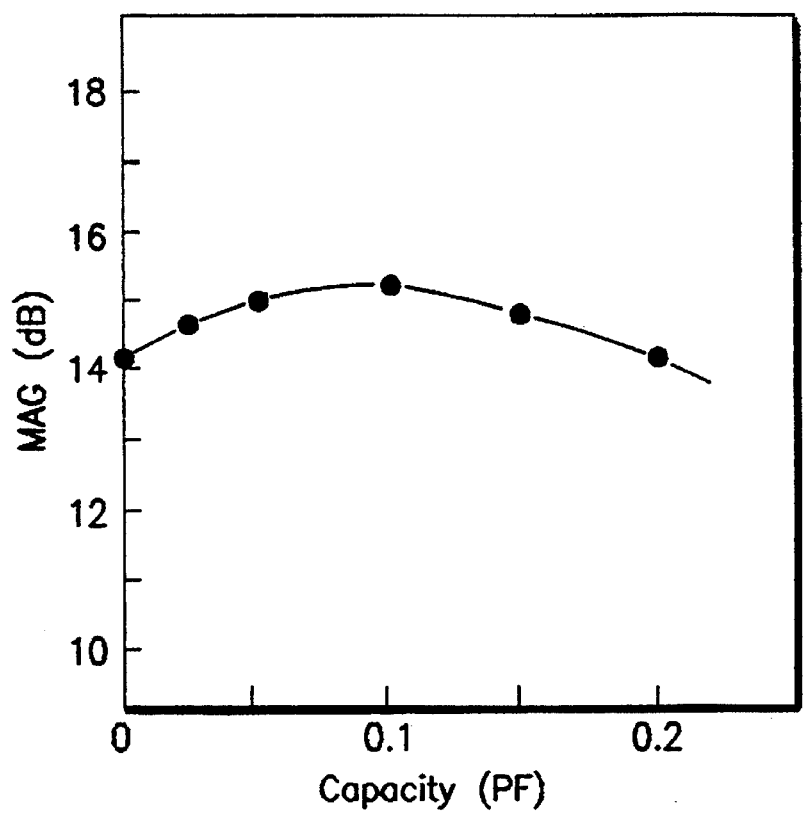
FIG. 2 is a graph showing relationship between output capacities and MAG.

As an FET element 1, an element of a gate length of 0.15 μm and the gate width Wg of 200 μm are mounted in the case, and a plot of the output side capacities versus the maximum available gain (MAG) obtained from the S parameters is shown in FIG. 2. FIG. 2 is a plot of MAG at 12 GHz, and as FIG. 2 shows, the improvement of MAG by about 1 dB is achieved by increasing the output side parasitic capacitance of the case by 0.1 pF.

Figure 3:
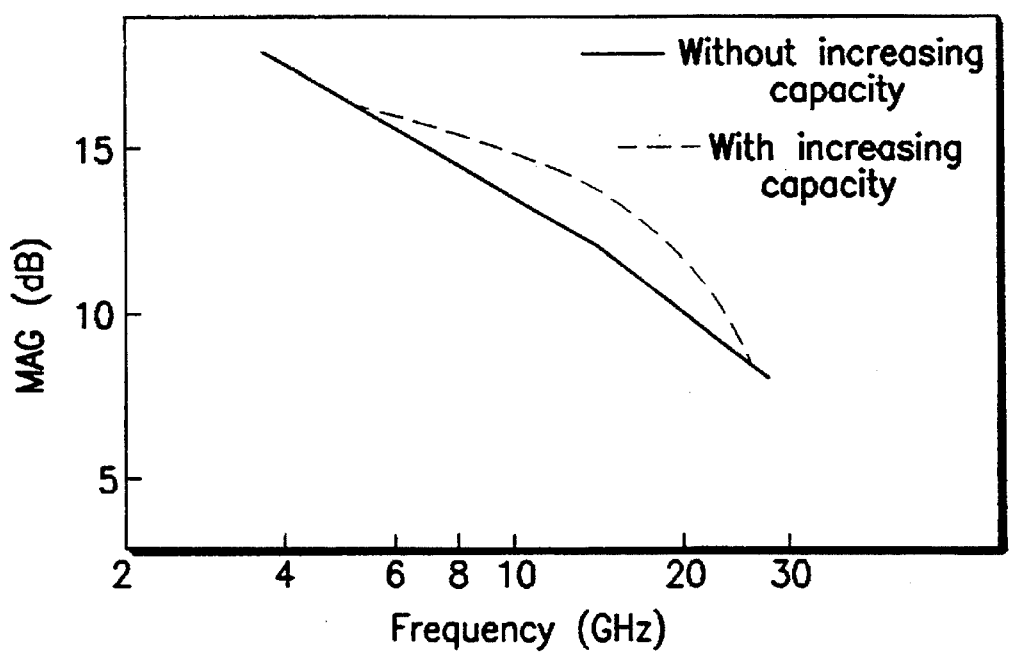
FIG. 3 is a graph showing a plot of frequency characteristics versus MAG obtained from S parameters.

FIG. 3 shows frequency characteristics when the output side parasitic capacitance of the case is increased by 0.1 pF, and is not increased. As FIG. 3 shows, when the parasitic capacitance is increased by 0.1 pF, the gain increases in the band between 6 and 20 GHz, and at 12 GHz, a improvement of about 1 dB is achieved. That is, according to this embodiment, the improvement of gain characteristics in a specific frequency band is achieved.

Figure 4:
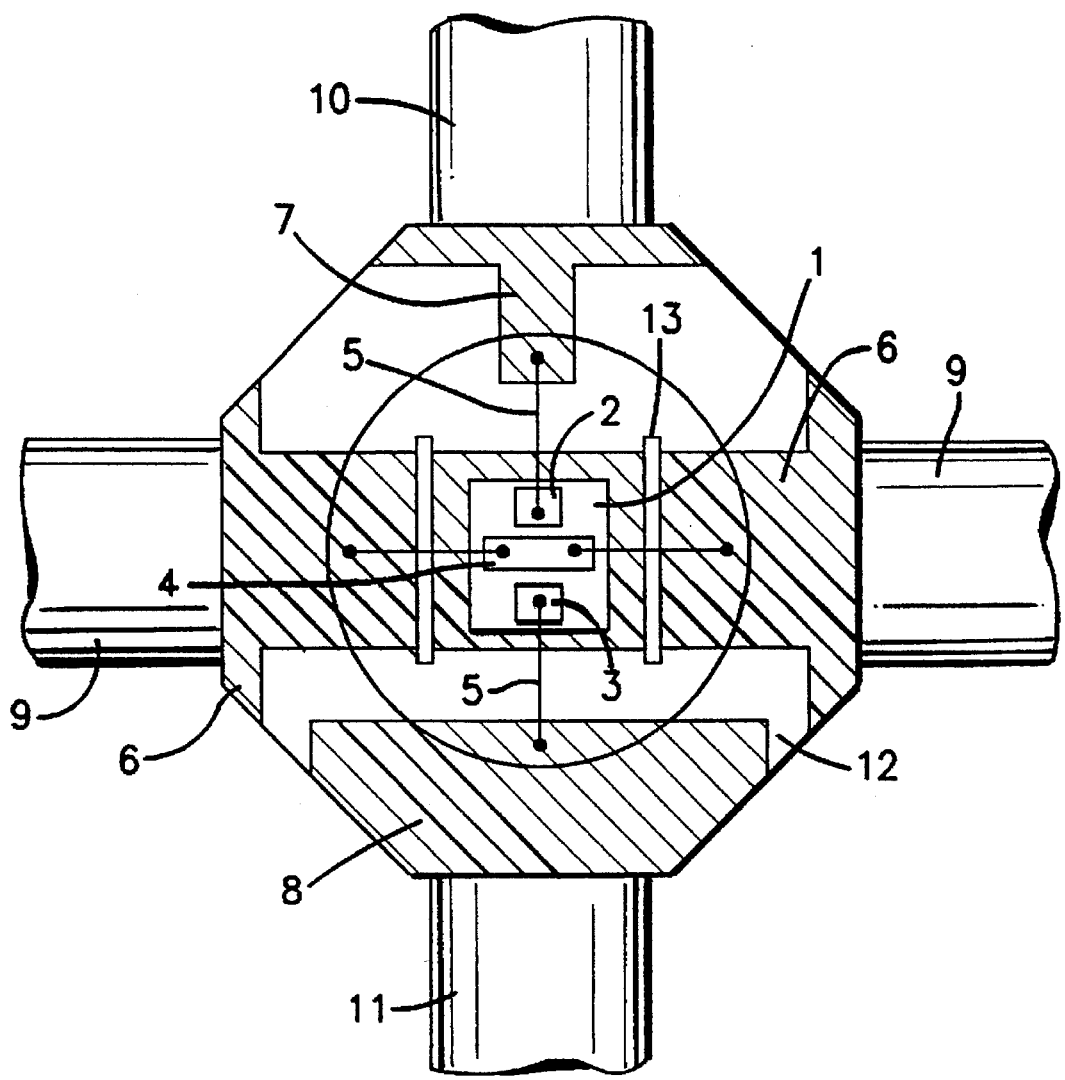
FIG. 4 is a plan view showing the semiconductor device according to the second embodiment of the present invention.
Figure 5:
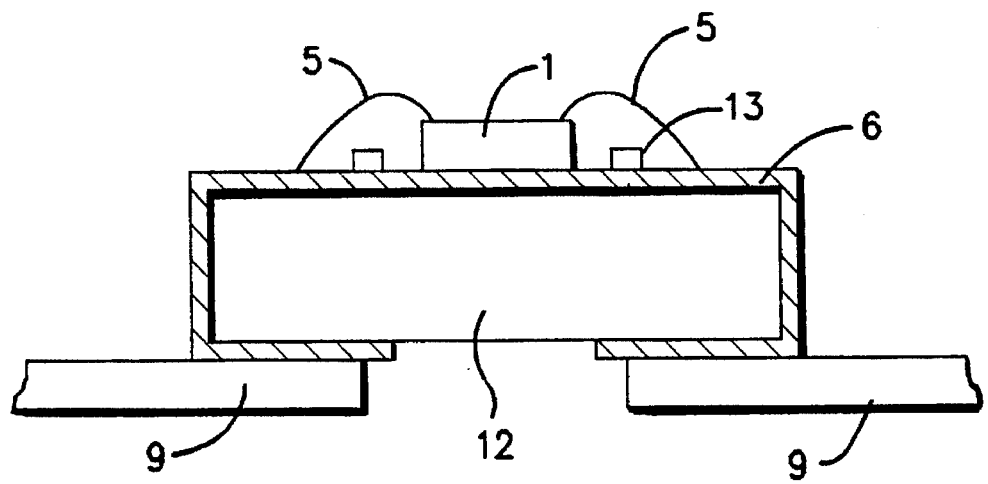
FIG. 5 is a cross sectional view of the semiconductor device.

FIG. 4 is a plan view showing the second embodiment of the present invention.

In FIG. 4, the same symbols are used for the same parts of the embodiment shown in FIG. 1, and repetition of the description thereof is omitted.

In the case of the semiconductor device of this embodiment, the same effect as in the case of the first embodiment is achieved by making the drain metalized pattern 8 have a form which extends toward the source metalized pattern 6, to thereby to increase the parasitic capacitance by 0.1 pF. As shown in FIG. 4, the position and shape of the drain metalized pattern 8 decreases the average distance between the source metalized pattern 6 and the drain metalized pattern 8, as compared to that of the average distance shown in FIG. 6, to thereby increase the area of the drain metalized pattern 8 which faces the source metalized pattern 6, as compared to FIG. 6.

As described above, the present invention has an effect to improve gain in a specific frequency band by increasing the earth parasitic capacitance of the output side, by making the forms of metalized pattern asymmetrical between the input side and the output side of the metalized pattern, each connected to input and output terminals of the case used in the FET element, respectively. This parasitic capacitance may be formed without altering the manufacturing process of the FET elements, and the improvement of gain is achieved without increasing the manufacturing costs.

What is claimed is:

1. A semiconductor device comprising:

a base case;

a first conductive pattern formed on a surface of said base case to divide said surface of said base case into first and second parts, said first and second parts having a substantially same area;

a second conductive pattern formed on said first part of said surface of said base case;

a third conductive pattern formed on said second part of said surface of said base case; and a semiconductor element having first, second and third terminals and mounted on said first conductive pattern, said first terminal being connected to said first conductive pattern, said second terminal being connected to said second conductive pattern and receiving an input signal supplied to said second conductive pattern, and said third terminal being connected to said third conductive pattern and transferring an output signal outputted from said third terminal to said third conductive pattern in accordance with said input signal;

a first parasitic capacitance between said first conductive pattern and said third conductive pattern, said first parasitic capacitance being larger than a second parasitic capacitance between said first conductive pattern and said second conductive pattern.

2. A semiconductor device comprising:

a base case;

a first conductive pattern formed on a surface of said base case to divide said surface of said base case into first and second parts, said first and second parts having a substantially same area;

a second conductive pattern formed on said first part of said surface of said base case and having a predetermined area;

a third conductive pattern formed on said second part of said surface of said base case and having a substantially same area as said second conductive pattern;

a semiconductor element having first, second and third terminals and mounted on said first conductive pattern, said first terminal being connected to said first conductive pattern, said second terminal being connected to said second conductive pattern and receiving an input signal supplied to said second conductive pattern, and said third terminal being connected to said third conductive pattern for transferring an output signal outputted from said third terminal to said third conductive pattern in accordance with said input signal;

a first conductive convex part formed elongated toward said second conductive pattern on said first part of said surface of said base case, connected to said first conductive pattern, and having a first length and a first width; and a second conductive convex part formed elongated toward said third conductive pattern on said second part of said surface of said base case, connected to said first conductive pattern, and having a second length longer than said first length and a second width larger than said first width for increasing a parasitic capacitance between said first conductive pattern including said second conductive convex part and said third conductive pattern;

said parasitic capacitance between said first conductive pattern including said second conductive convex part and said third conductive pattern being larger than a parasitic capacitance between said first conductive pattern including said first conductive convex part and said second conductive pattern.

3. A semiconductor device comprising:

a base case;

a first conductive pattern formed on a surface of said base case to divide said surface of said base case into first and second parts, said first and second parts having a substantially same area;

a second conductive pattern formed on said first part of said surface of said base case and having a first area;

a third conductive pattern formed on said second part of said surface of said base case and having a second area larger than said first area for decreasing an average distance between said first conductive pattern and said third conductive pattern;

a semiconductor element having first, second and third terminals and mounted on said first conductive pattern, said first terminal being connected to said first conductive pattern, said second terminal being connected to said second conductive pattern for receiving an input signal supplied to said second conductive pattern, and said third terminal connected to said third conductive pattern for transferring an output signal outputted from said third terminal to said third conductive pattern in accordance with said input signal;

a first parasitic capacitance between said first conductive pattern and said third conductive pattern, said first parasitic capacitance being larger than a second parasitic capacitance between said first conductive pattern and said second conductive pattern.

* * * * *